(12) United States Patent
Park et al.

(10) Patent No.: US 11,825,675 B2
(45) Date of Patent: Nov. 21, 2023

(54) ORGANIC LIGHT-EMITTING DIODE INCLUDING A HOLE INJECTION LAYER, AND METHOD OF MANUFACTURING THE SAME

(71) Applicant: Samsung Display Co., Ltd., Yongin-si (KR)

(72) Inventors: Yeongrong Park, Yongin-si (KR);
Dongkyu Seo, Yongin-si (KR);
Junyong Shin, Yongin-si (KR);
Byeongwook Yoo, Yongin-si (KR);
Daeho Lee, Yongin-si (KR);
Byungseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 17/231,968

(22) Filed: Apr. 15, 2021

(65) Prior Publication Data

US 2022/0059792 A1   Feb. 24, 2022

(30) Foreign Application Priority Data

Aug. 21, 2020   (KR) .................. 10-2020-0105531

(51) Int. Cl.
*H10K 50/15*   (2023.01)
*H10K 50/17*   (2023.01)
*H10K 71/00*   (2023.01)

(52) U.S. Cl.
CPC ............. *H10K 50/15* (2023.02); *H10K 50/17* (2023.02); *H10K 71/00* (2023.02)

(58) Field of Classification Search
CPC . H01L 51/5056; H01L 51/5088; H01L 51/56; H01L 51/5004; H01L 2251/55; H10K 50/15; H10K 50/17; H10K 71/00; H10K 50/11; H10K 2101/40; H10K 2101/00
See application file for complete search history.

(56) References Cited

U.S. PATENT DOCUMENTS 7,875,895 B2   1/2011   Kwack et al.
9,985,235 B2   5/2018   Kim et al.
10,158,095 B2   12/2018   Kim et al.
10,367,163 B2   7/2019   Kim et al.
(Continued)

FOREIGN PATENT DOCUMENTS

JP   2007-262391 A   10/2007
KR   10-0873082 B1   12/2008
(Continued)

*Primary Examiner* — Caleb E Henry
(74) *Attorney, Agent, or Firm* — Lewis Roca Rothgerber Christie LLP (57) ABSTRACT

An organic light-emitting diode includes: a first electrode and a second electrode facing each other; an organic emission layer between the first electrode and the second electrode; and a hole injection layer between the first electrode and the organic emission layer, wherein the hole injection layer includes a second metal compound layer and a second metal layer, the second metal compound layer being between the first electrode and the organic emission layer, and the second metal layer being between the second metal compound layer and the organic emission layer.

10 Claims, 7 Drawing Sheets

(56) References Cited

U.S. PATENT DOCUMENTS

| | | | |
|---|---|---|---|
| 2004/0056590 A1* | 3/2004 | Lim | H10K 50/852 313/506 |
| 2007/0205428 A1 | 9/2007 | Katayama et al. | |
| 2011/0121271 A1 | 5/2011 | Jeon et al. | |
| 2013/0056719 A1* | 3/2013 | Komatsu | H01L 27/3276 438/34 |
| 2013/0126840 A1* | 5/2013 | Fujimura | H05B 33/22 438/46 |
| 2013/0126842 A1* | 5/2013 | Takeuchi | H01L 51/56 438/30 |
| 2013/0134474 A1* | 5/2013 | Takeuchi | H01L 33/42 438/22 |
| 2017/0309833 A1* | 10/2017 | Lei | H01L 51/506 |
| 2018/0226024 A1* | 8/2018 | Tang | H10K 71/00 |
| 2018/0269421 A1* | 9/2018 | Pan | H01L 51/5024 |
| 2019/0081116 A1* | 3/2019 | Kondo | H01L 27/3218 |
| 2019/0267438 A1* | 8/2019 | Goto | H01L 27/3223 |
| 2020/0013977 A1* | 1/2020 | Wang | H01L 51/5068 |
| 2020/0161594 A1* | 5/2020 | Kondo | H01L 51/56 |

FOREIGN PATENT DOCUMENTS

| | | |
|---|---|---|
| KR | 10-2011-0058126 A | 6/2011 |
| KR | 10-2016-0148121 A | 12/2016 |
| KR | 10-1733151 B1 | 5/2017 |
| KR | 10-2018-0094535 A | 8/2018 |

* cited by examiner

ORGANIC LIGHT-EMITTING DIODE INCLUDING A HOLE INJECTION LAYER, AND METHOD OF MANUFACTURING THE SAME

CROSS-REFERENCE TO RELATED APPLICATION

This application claims priority to and the benefit of Korean Patent Application No. 10-2020-0105531, filed on Aug. 21, 2020, the entire content of which is hereby incorporated by reference.

BACKGROUND

1. Field

One or more embodiments relate to an organic light-emitting diode and a method of manufacturing the same, and more particularly, to an organic light-emitting diode in which light-emitting efficiency is improved and a method of manufacturing the same.

2. Description of Related Art

Among display apparatuses, an organic light-emitting display apparatus has advantages of a wide viewing angle, excellent contrast, and fast response speeds, and thus, is in the limelight as a next-generation display apparatus.

An organic light-emitting display apparatus is a self-luminous display apparatus and does not require a separate light source, and thus, may be driven at a low voltage. In addition, an organic light-emitting display apparatus may be configured in a lightweight thin profile and has high-quality characteristics of a wide viewing angle, high contrast, fast response speeds, etc., and thus, is in limelight as a next-generation display apparatus.

An organic light-emitting display apparatus includes an organic light-emitting diode including a hole injection electrode, an electron injection electrode, and an organic emission layer therebetween. An organic light-emitting display apparatus is a self-luminous display apparatus in which light is emitted when excitons fall from an excited state to a ground state, the excitons being created when holes injected from the hole injection electrode and electrons injected from the electron injection electrode combine in the organic emission layer.

SUMMARY

One or more aspects of embodiments of the present disclosure are directed towards an organic light-emitting diode in which light-emitting efficiency is improved and that is advantageous in an aspect of process, and a method of manufacturing the organic light-emitting diode. However, such an aspect is an example, and the disclosure is not limited thereto.

Additional aspects will be set forth in part in the description which follows and, in part, will be apparent from the description, or may be learned by practice of the presented embodiments of the disclosure.

According to one or more embodiments, an organic light-emitting diode includes a first electrode and a second electrode facing each other, an organic emission layer between the first electrode and the second electrode, and a hole injection layer between the first electrode and the organic emission layer, wherein the hole injection layer includes a second metal compound layer and a second metal layer, the second metal compound layer being between the first electrode and the organic emission layer, and the second metal layer being between the second metal compound layer and the organic emission layer.

A second metal compound of the second metal compound layer may include (e.g., be) a dipole material including (e.g., being) a first metal and a halogen element, the first metal being the same as a metal of the first electrode.

A work function of the second metal compound layer and a work function of the second metal layer may each be greater than a work function of the first electrode.

A work function of the second metal layer may be greater than a work function of the second metal compound layer.

The hole injection layer may further include a residual layer of a first metal compound layer, the residual layer being between the second metal layer and the organic emission layer.

A first metal compound of the first metal compound layer may include (e.g., be) a material including (e.g., being) a second metal of the second metal layer and a halogen element (e.g., the second metal of the second metal layer and the halogen element may be combined with each other).

A second metal compound of the second metal compound layer may include (e.g., be) a dipole material including (e.g., being) a first metal and a halogen element, the first metal being the same as a metal of the first electrode.

A work function of the first metal compound layer, a work function of the second metal compound layer, and a work function of the second metal layer may each be greater than a work function of the first electrode.

A work function of the second metal layer may be greater than a work function of the first metal compound layer and greater than a work function of the second metal compound layer.

The organic light-emitting diode may further include a hole transport layer between the hole injection layer and the organic emission layer.

According to one or more embodiments, a method of manufacturing an organic light-emitting diode includes forming a first electrode over a substrate, the first electrode including (e.g., being) a first metal, forming a first metal layer on the first electrode, the first metal layer including (e.g., being) the first metal, forming a hole injection layer by forming a first metal compound layer on the first metal layer, the hole injection layer including a second metal compound layer and a second metal layer, the second metal layer being on the second metal compound layer, the second metal compound layer being formed by oxidizing the first metal layer through the first metal compound layer, and the second metal layer being formed by reducing the first metal compound layer through the first metal layer, forming an organic emission layer on the hole injection layer, and forming a second electrode on the organic emission layer.

A second metal compound of the second metal compound layer may include (e.g., be) a dipole material including (e.g., being) a first metal of the first metal layer and a halogen element of a first metal compound of the first metal compound layer (e.g., the first metal of the first metal layer and the halogen element of the first metal compound of the first metal compound layer may be combined with each other).

A work function of the second metal compound layer and a work function of the second metal layer may each be greater than a work function of the first electrode.

A work function of the second metal layer may be greater than a work function of the second metal compound layer.

The method may further include forming a hole transport layer on the hole injection layer, wherein the hole transport layer may be arranged between the hole injection layer and the organic emission layer.

According to one or more embodiments, a method of manufacturing an organic light-emitting diode includes forming a first electrode over a substrate, the first electrode including (e.g., being) a first metal, forming a first metal layer on the first electrode, the first metal layer including (e.g., being) the first metal, forming a hole injection layer by forming a first metal compound layer on the first metal layer, the hole injection layer including a second metal compound layer, a second metal layer, and a residual layer of the first metal compound layer, the second metal layer being on the second metal compound layer, the second metal compound layer being formed by oxidizing the first metal layer through the first metal compound layer, and the second metal layer being formed by reducing the first metal compound layer through the first metal layer, forming an organic emission layer on the hole injection layer, and forming a second electrode on the organic emission layer.

A first metal compound of the first metal compound layer may include (e.g., be) a material including (e.g., being) a second metal of the second metal layer and a halogen element.

A second metal compound of the second metal compound layer may include (e.g., be) a dipole material including (e.g., being) a first metal of the first metal layer and the halogen element of the first metal compound (that are combine with each other).

A work function of the first metal compound layer, a work function of the second metal compound layer, and a work function of the second metal layer may each be greater than a work function of the first electrode.

A work function of the second metal layer may be greater than a work function of the first metal compound layer and greater than a work function of the second metal compound layer.

These and/or other aspects will become apparent and more readily appreciated from the following description of some embodiments, the accompanying drawings, and the claims.

These general and specific aspects may be implemented by utilizing a system, a method, a computer program, or a combination of a certain system, method, and computer program.

BRIEF DESCRIPTION OF THE DRAWINGS

The above and other aspects and features of embodiments of the disclosure will be more apparent from the following description taken in conjunction with the accompanying drawings, in which.

DETAILED DESCRIPTION

Reference will now be made in more detail to embodiments, examples of which are illustrated in the accompanying drawings, wherein like reference numerals refer to like elements throughout. In this regard, the present embodiments may have different suitable forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, the use of the term "may," when describing embodiments of the present disclosure, refers to "one or more embodiments of the present disclosure." As used herein, the terms "substantially," "about," and "approximately," as well as similar terms are used as terms of approximation and not as terms of degree, and are intended to account for the inherent deviations in measured or calculated values that would be recognized by those of ordinary skill in the art.

As the present description allows for various suitable changes and numerous embodiments, some embodiments will be illustrated in the drawings and described in the written description. Aspects and features of the disclosure, and methods for achieving them will be clarified with reference to embodiments described below in more detail with reference to the drawings. However, the disclosure is not limited to the following embodiments and may be embodied in various suitable forms.

Hereinafter, embodiments will be described with reference to the accompanying drawings, wherein like reference numerals refer to like elements throughout and a repeated description thereof may not be provided.

While such terms as "first" and "second" may be used to describe various components, such components are not limited by the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and "including" as used herein specify the presence of stated features and/or components but do not preclude the addition of one or more other features and/or components.

It will be further understood that, when a layer, region, or component is referred to as being "on" another layer, region, or component, it can be directly or indirectly on the other layer, region, or component. For example, one or more intervening layers, regions, and/or components may be present.

Sizes of elements in the drawings may be exaggerated or reduced for convenience of explanation. For example, because sizes and thicknesses of elements in the drawings may be exaggerated for convenience of explanation, the disclosure is not limited thereto.

When an embodiment may be implemented differently, a certain process order may be performed differently from the described order. For example, two consecutively described processes (e.g., two processes that are described as being performed consecutively) may be performed substantially at the same time or may be performed in an order opposite to the described order.

In the present specification, "A and/or B" means A or B, or A and B. In the present specification, "at least one selected from among A and B" means A or B, or A and B.

It will be further understood that, when layers, regions, and/or components are referred to as being connected to each other, they may be directly connected to each other or indirectly connected to each other with one or more intervening layers, regions, and/or components therebetween. For example, when layers, regions, and/or components are referred to as being electrically coupled (e.g., connected) to each other, they may be directly electrically coupled (e.g., connected) to each other or indirectly electrically coupled (e.g., connected) to each other with one or more intervening layers, regions, and/or components therebetween.

The x-axis, the y-axis, and the z-axis are not limited to three axes of a rectangular coordinate system and may be interpreted in a broader sense. For example, the x-axis, the y-axis, and the z-axis may be perpendicular to one another or may represent different directions that are not perpendicular to one another.

Hereinafter, embodiments are described in more detail with reference to the accompanying drawings.

Figure 1:
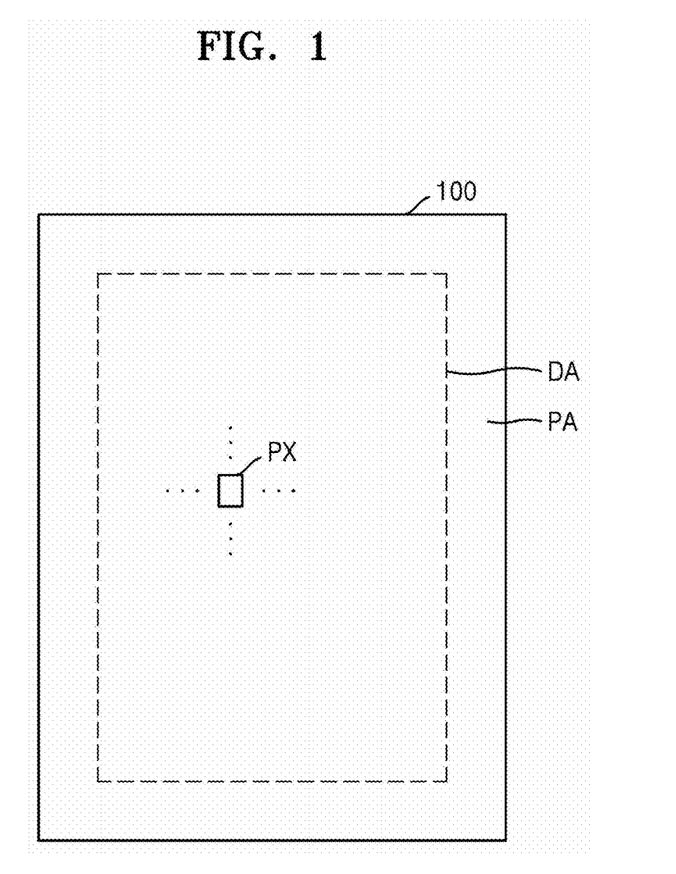
FIG. 1 is a perspective view of a portion of a display apparatus according to an embodiment.

FIG. 1 is a plan view of a portion of a display apparatus according to an embodiment.

The display apparatus according to an embodiment may include an apparatus for displaying moving images and/or still images and may be utilized as a display screen of various suitable products including televisions, notebook computers, monitors, advertisement boards, Internet of things (IOT) devices, as well as portable electronic apparatuses including mobile phones, smart phones, tablet personal computers (PC), mobile communication terminals, electronic organizers, electronic books, portable multimedia players (PMP), navigation devices, and ultra mobile personal computers (UMPC). In addition, the display apparatus according to an embodiment may be utilized in wearable devices including smartwatches, watchphones, glasses-type displays (e.g., a display that is incorporated into, or integrated with, glasses), and head-mounted displays (HMD). However, the present disclosure is not limited thereto.

Though it is shown in FIG. 1 that the display apparatus is a flat-panel display apparatus having a flat shape, the display apparatus may be, for example, a flexible display apparatus and thus is easily bendable, foldable, and/or rolled. As an example, the display apparatus may include a foldable display apparatus that may be folded and/or unfolded, a curved display apparatus in which a display surface is bent (e.g., curved), a bendable display apparatus in which a region excluding a display surface may be bent, a rollable display apparatus that may be rolled and/or unrolled, and a stretchable display apparatus that is stretchable.

As shown in FIG. 1, the display apparatus according to an embodiment includes a display area DA that is to emit light and a peripheral area PA that does not emit light. The peripheral area PA may partially or entirely surround the display area DA. A substrate may include a first region and a second region, the first region corresponding to the display area DA, and the second region corresponding to the peripheral area PA. Pixel circuits and display elements may be arranged in the first region of the substrate, the display elements being respectively and electrically coupled (e.g., connected) to the pixel circuits. In addition, the peripheral area PA may include a pad area in at least one side thereof.

FIG. 1 shows the display apparatus including the display area DA having a rectangular shape in a plan view. As shown in FIG. 1, the display area DA may have a rectangular planar shape having short sides in a first direction (an X-direction) and long sides in a second direction (a Y-direction). An edge where a short side in the first direction (the X-direction) and a long side in the second direction (the Y-direction) meet each other may have a round shape having a set or preset curvature or a rectangular shape. The planar shape of the display area DA is not limited to the above example and may be other suitable polygons, ellipses, or amorphous shapes.

In an embodiment, the display apparatus may include a component arranged on a side of a display panel. The component may include an electronic element that utilizes light and/or sound. The electronic element may include a sensor such as an infrared sensor that emits and/or receives light, a camera that receives light to capture an image, a sensor that outputs and senses light and/or sound to measure a distance or recognize an object (e.g., a fingerprint), a small lamp that outputs light, and/or a speaker that outputs sound.

Figure 2:
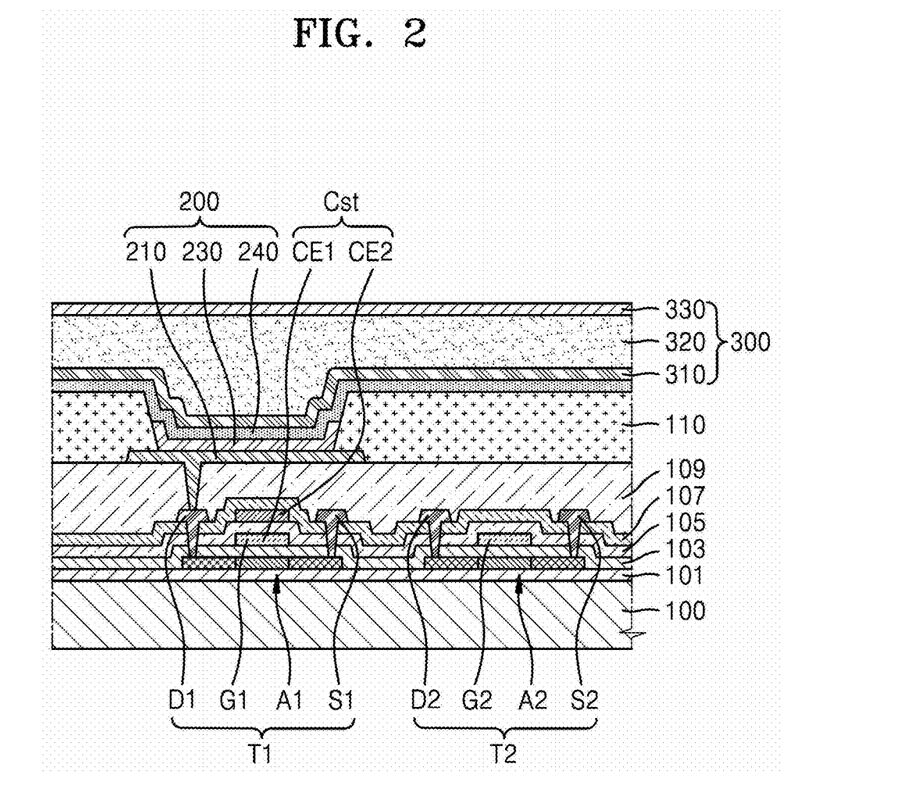
FIG. 2 is a cross-sectional view of a portion of the display apparatus of FIG. 1.

FIG. 2 is a cross-sectional view of a portion of the display apparatus of FIG. 1.

The substrate 100 may include (e.g., be) glass, metal, and/or a polymer resin. In the case where the substrate 100 is suitably flexible and/or bendable, the substrate 100 may include (e.g., be) a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 may have a multi-layered structure including two layers, each of the two layers including the polymer resin, and a barrier layer arranged therebetween and including (e.g., being) an inorganic material (such as silicon oxide, silicon nitride, and/or silicon oxynitride). However, various suitable modifications may be made.

A buffer layer 101 may be arranged on the substrate 100. The buffer layer 101 may include (e.g., be) an inorganic material such as silicon oxide, silicon nitride, and/or silicon oxynitride and may have a single-layered or multi-layered structure. In addition, the buffer layer 101 may extend to the display area and a non-display area. The buffer layer 101 may increase the flatness of the top surface of the substrate 100 and/or prevent or reduce the penetration of impurities and/or moisture from the outside of the substrate 100 into an active layer.

A pixel circuit may be arranged on the buffer layer 101 in the display area DA. In an embodiment, a pixel circuit of each of pixels arranged in the display area DA may include a plurality of thin-film transistors and a storage capacitor Cst. The number of thin film-transistors of each pixel is not limited. For example, two to seven thin-film transistors may be provided. However, various suitable modifications may be made. In addition, each pixel may further include a capacitor.

Each thin-film transistor may include a semiconductor layer, a gate electrode, a source electrode, and a drain electrode. In an embodiment, as shown in FIG. 2, a first thin-film transistor T1 may include a first semiconductor layer A1, a first gate electrode G1, a first source electrode S1, and a first drain electrode D1. A second thin-film transistor T2 may include a second semiconductor layer A2, a second gate electrode G2, a second source electrode S2, and a second drain electrode D2. In this case, the first thin-film transistor T1 may be coupled (e.g., connected) to an organic light-emitting diode 200 to serve as a driving thin-film transistor that drives the organic light-emitting diode 200. The second thin-film transistor T2 may be coupled (e.g., connected) to a data line to serve as a switching thin-film transistor. Here, more detailed configurations of a display apparatus according to an embodiment are described. These may be equally applicable to at least one (e.g. the first and second thin-film transistors T1 and T2) of a plurality of thin-film transistors of the display apparatus.

A semiconductor layer may be arranged on the buffer layer 101 and may include (e.g., be) amorphous silicon and/or polycrystalline silicon. In an embodiment, the semiconductor layer may include (e.g., be) an oxide of at least one selected from among indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), and zinc (Zn). In addition, the semiconductor layer may include (e.g., be) one or more Zn-oxide-based materials. For example, the semiconductor layer may include (e.g., be) Zn-oxide, In—Zn oxide, and/or Ga—In—Zn oxide. In some embodiments, the semiconductor layer may include (e.g., be) In—Ga—Zn—O (IGZO), In—Sn—Zn—O (ITZO), and/or In—Ga—Sn—Zn—O (IGTZO) semiconductor containing metal such as indium (In), gallium (Ga), and tin (Sn) in ZnO. The semiconductor layer may include a source region and a drain region on two opposite sides of a channel region, doped with impurities. For example, at least one selected from among the source region, the drain region, and the channel region of the semiconductor layer may be doped with impurities.

The gate electrode is arranged over the semiconductor layer to overlap at least a portion of the semiconductor layer. For example, the gate electrode may overlap the channel region of the semiconductor layer. The gate electrode may include (e.g., be) various suitable conductive materials including (e.g., being) aluminum (Al), copper (Cu), and/or titanium (Ti) and may have various suitable layered structures. As an example, the gate electrode may include a molybdenum (Mo) layer and/or an Al layer, or the gate electrode may have a multi-layered structure of Mo/Al/Mo. In some embodiments, the gate electrode may have a multi-layered structure including (e.g., being) an indium tin oxide (ITO) layer covering a metal material.

The source electrode and the drain electrode may include (e.g., be) various suitable conductive materials including (e.g., being) molybdenum (Mo), aluminum (Al), copper (Cu), and/or titanium (Ti) and may have various suitable layered structures. As an example, the source electrode and/or the drain electrode may include a Ti layer and/or an Al layer, or may have a multi-layered structure of Ti/Al/Ti. The source electrode and the drain electrode may be respectively coupled (e.g., connected) to a source region and a drain region of the semiconductor layer through a contact hole (e.g., through respective contact holes). In some embodiments, the source electrode and/or the drain electrode may have a multi-layered structure including an ITO layer covering a metal material.

To secure insulation between the semiconductor layer and the gate electrode, a first inorganic insulating layer 103 may be arranged between the semiconductor layer and the gate electrode. For example, the first inorganic insulating layer 103 is arranged over the substrate 100, is arranged under the gate electrode, and may cover the semiconductor layer. The first inorganic insulating layer 103 may include an insulating layer including (e.g., being) an inorganic material such as silicon oxide, silicon nitride, and/or silicon oxynitride.

A second inorganic insulating layer 105 may be arranged on the first inorganic insulating layer 103 and may cover the gate electrode. The second inorganic insulating layer 105 may include an insulating layer including (e.g., being) an inorganic material such as silicon oxide, silicon nitride, and/or silicon oxynitride.

The storage capacitor Cst may include a bottom electrode CE1 and a top electrode CE2.

The bottom electrode CE1 may be coupled (e.g., connected) to the first gate electrode G1 of the first thin-film transistor T1. In some embodiments, the first gate electrode G1, or a part of the first gate electrode G1, may be the bottom electrode CE1. The top electrode CE2 may be coupled (e.g., connected) to a driving voltage line. In this case, the bottom electrode CE1 and the first gate electrode G1 may be provided as one body. For example, the first gate electrode G1 may serve as not only a control electrode of the first thin-film transistor T1, but also may serve as the bottom electrode CE1 of the storage capacitor Cst. The storage capacitor Cst may maintain a voltage applied to the first gate electrode G1 by storing and maintaining a voltage corresponding to a voltage difference between two ends of the driving voltage line and the first gate electrode G1.

The top electrode CE2 overlaps the bottom electrode CE1 with the second inorganic insulating layer 105 therebetween. In this case, the second inorganic insulating layer 105 may serve as a dielectric layer of the storage capacitor Cst. The top electrode CE2 may include (e.g., be) a conductive material including (e.g., being) molybdenum (Mo), aluminum (Al), copper (Cu), and/or titanium (Ti) and include a single layer or a multi-layer structure including (e.g., being) the above materials. As an example, the top electrode CE2 may include a single Mo layer or a multi-layer of Mo/Al/Mo. In some embodiments, the source electrode and the drain electrode may have a multi-layered structure including an ITO layer covering a metal material.

A third inorganic insulating layer 107 may be arranged on the second inorganic insulating layer 105 and may cover the top electrode CE2 of the storage capacitor Cst. For example, the top electrode CE2 may be arranged between the second inorganic insulating layer 105 and the third inorganic insulating layer 107. In addition, the source electrode and the drain electrode may be arranged on the third inorganic insulating layer 107. The third inorganic insulating layer 107 may include an insulating layer including (e.g., being) an inorganic material such as silicon oxide, silicon nitride, and/or silicon oxynitride.

A protective layer may be arranged on the third inorganic insulating layer 107 and may cover the source electrode and the drain electrode. The protective layer may include an insulating layer including (e.g., being) an inorganic material such as silicon oxide, silicon nitride, and/or silicon oxynitride.

In some embodiments, the inorganic insulating layers, for example, the first inorganic insulating layer 103, the second inorganic insulating layer 105, and the third inorganic insulating layer 107, and the protective layer including (e.g., being) the respective inorganic materials, may be formed through chemical vapor deposition (CVD) and/or atomic layer deposition (ALD), but the present disclosure is not limited thereto.

An organic insulating layer 109 may be arranged on the source electrode and the drain electrode. The organic insulating layer 109 may be arranged over the substrate 100, over the display area DA, and over the peripheral area PA outside (e.g., surrounding) the display area DA. The organic insulating layer 109 may have a flat top surface such that a first electrode 210 is formed flat. The organic insulating layer 109 may include a single layer or a multi-layer including (e.g., being) an organic material. The organic insulating layer 109 may include (e.g., be) a general-purpose polymer such as benzocyclobutene (BCB), polyimide, hexamethyldisiloxane (HMDSO), polymethylmethacrylate (PMMA) and/or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

In the display area DA of the substrate 100, the organic light-emitting diode 200 is arranged on the organic insulating layer 109. The organic light-emitting diode 200 may include the first electrode 210, a second electrode 240, and an intermediate layer 230 therebetween, the intermediate layer 230 including an emission layer EML.

In an embodiment, the first electrode 210 may be a pixel electrode. In this case, the first electrode 210 is electrically coupled (e.g., connected) to the thin-film transistor by contacting one of the source electrode and the drain electrode through a contact hole formed in the organic insulating layer 109, etc. The first electrode 210 may be a (semi) transparent electrode or a reflective electrode. In an embodiment, the first electrode 210 may include a reflective layer and a transparent or semi-transparent electrode layer on the reflective layer, the reflective layer including (e.g., being) at least one selected from among silver (Ag), magnesium (Mg), aluminum (Al), platinum (Pt), palladium (Pd), gold (Au), nickel (Ni), neodymium (Nd), iridium (Ir), chrome (Cr), and a compound thereof. The transparent or semi-transparent electrode layer may include (e.g., be) at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). In addition, the first electrode 210 may have a stack structure of ITO layers and a metal layer therebetween. As an example, the first electrode 210 may have a stack structure of ITO/Ag/ITO.

A pixel-defining layer 110 may be arranged on the organic insulating layer 109 over the display area DA and the peripheral area PA. The pixel-defining layer 110 may define a pixel (or an emission area) by including an opening corresponding to each pixel. In this case, the opening is formed to expose at least a portion of the central portion of the first electrode 210. For example, the pixel-defining layer 110 may cover a part (e.g., edges) of the first electrode 210 and may expose another part (e.g., a center part) of the first electrode 210.

In addition, the pixel-defining layer 110 may prevent or suppress an arc, etc. from occurring at the edges of the first electrode 210 by increasing a distance between the edges of the first electrode 210 and the second electrode 240 over the first electrode 210. The pixel-defining layer 110 may include (e.g., be) one or more organic insulating materials selected from the group including polyamide, polyimide, acrylic resin, BCB, and phenolic resin, and may be formed by a method such as spin coating. However, the present disclosure is not limited thereto.

Figure 3:
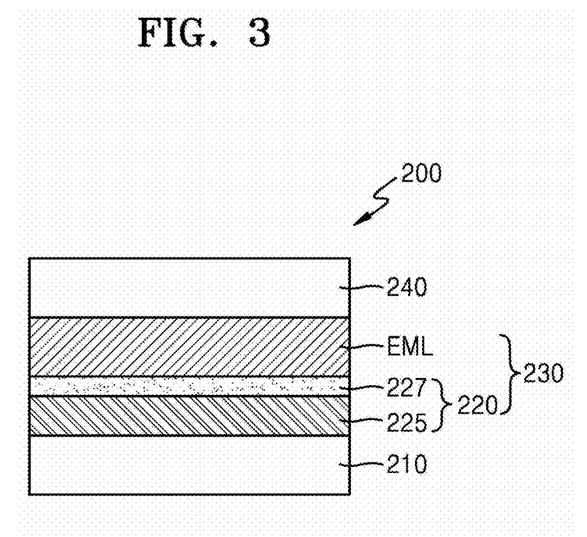
FIG. 3 is a view of a stack structure of an organic light-emitting diode according to an embodiment.

The intermediate layer 230 of the organic light-emitting diode 200 may include the emission layer EML (see FIG. 3). The emission layer EML may include (e.g., be) an organic material including (e.g., being) a fluorescent and/or phosphorous material to emit red, green, blue, or white light. The emission layer EML may be an organic emission layer including (e.g., being) a low molecular weight organic material and/or a polymer organic material. As an example, the emission layer EML is an organic emission layer and may include (e.g., be) copper phthalocyanine (CuPc), a tris-8-hydroxyquinoline aluminum (Alq3)-based material, and/or a polyfluorene-based material. Though the organic emission layer may be formed through vacuum deposition, screen printing, inkjet printing, and/or laser induced thermal imaging (LITI), the present disclosure is not limited thereto.

A functional layer may be selectively further arranged under and on the emission layer EML, the functional layer including a hole injection layer (HIL) 220, a hole transport layer (HTL), an electron transport layer (ETL), and/or an electron injection layer (EIL). For example, the intermediate layer 230 may include an organic emission layer and/or at least one functional layer and may have a stack structure of a single or composite configuration.

Though the intermediate layer 230 may be formed through screen printing, inkjet printing, deposition, and/or laser induced thermal imaging (LITI), the present disclosure is not limited thereto.

As shown in FIG. 2, though the intermediate layer 230 may include a layer patterned to correspond to the respective pixels, the present disclosure is not limited thereto. In some embodiments, the intermediate layer 230 may include a layer having one body over a plurality of pixels. However, various suitable modifications may be made.

The second electrode 240 is arranged over the display area DA. In an embodiment, the second electrode 240 may be an opposite electrode. In an embodiment, the second electrode 240 may include a layer formed as one body to cover the entire surface of the display area DA and may be arranged over the display area DA. For example, the second electrode 240 may be formed as one body over a plurality of pixels to respectively correspond to a plurality of first electrodes 210. In this case, the second electrode 240 may cover the display area DA and may extend to (e.g., up to or into) a portion of the peripheral area PA outside (e.g., surrounding) the display area DA. In an embodiment, the second electrode 240 may be patterned to respectively correspond to the plurality of first electrodes 210.

The second electrode 240 may be a transparent electrode or a reflective electrode. In an embodiment, the second electrode 240 may be a transparent or semi-transparent electrode and may include a metal thin film having a small work function and including (e.g., being) at least one selected from among Li, Ca, LiF/Ca, LiF/Al, Al, Ag, Mg, and a compound thereof. In addition to the metal thin film, a transparent conductive oxide (TCO) film such as ITO, IZO, ZnO, or $In_2O_3$ may be further included.

Because the organic light-emitting diode 200 may be easily damaged by external moisture and/or oxygen, etc., an encapsulation layer 300 may cover and protect the organic light-emitting diode 200. The encapsulation layer 300 may cover the display area DA and may extend to the outside of the display area DA. As shown in FIG. 2, the encapsulation layer 300 may include a first inorganic encapsulation layer 310, an organic encapsulation layer 320, and a second inorganic encapsulation layer 330.

The first inorganic encapsulation layer 310 may cover the second electrode 240 and may include (e.g., be) silicon oxide, silicon nitride, and/or silicon oxynitride. Other layers such as a capping layer may be arranged between the first inorganic encapsulation layer 310 and the second electrode 240. Because the first inorganic encapsulation layer 310 is formed along the structure thereunder, the top surface of the first inorganic encapsulation layer 310 is not flat.

The organic encapsulation layer 320 may cover the first inorganic encapsulation layer 310. Unlike the first inorganic encapsulation layer 310, the top surface of the organic encapsulation layer 320 may be approximately or substantially flat. In an embodiment, a portion of the top surface of the organic encapsulation layer 320 that corresponds to the display area DA may be approximately flat. The organic encapsulation layer 320 may include (e.g., be) at least one selected from among polyethylene terephthalate, polyethylene naphthalate, polycarbonate, polyimide, polyethylene sulfonate, polyoxymethylene, polyarylate, and hexamethyldisiloxane.

The second inorganic encapsulation layer 330 may cover the organic encapsulation layer 320 and may include (e.g., be) silicon oxide, silicon nitride, and/or silicon oxynitride. The second inorganic encapsulation layer 330 may prevent the organic encapsulation layer 320 from being exposed to the outside, or may reduce the exposure of the organic encapsulation layer 320 to the outside, by contacting the first inorganic encapsulation layer 310 in the edges outside the display area DA. For example, first and second inorganic encapsulation layers 310 and 330 may extend beyond the organic encapsulation layer 320 in a plan view and may come into contact with each other to encapsulate the organic encapsulation layer 320.

Because the encapsulation layer 300 includes the first inorganic encapsulation layer 310, the organic encapsulation layer 320, and the second inorganic encapsulation layer 330, even when cracks occur inside the encapsulation layer 300, the cracks may not be coupled (e.g., connected) between the first inorganic encapsulation layer 310 and the organic encapsulation layer 320 or between the organic encapsulation layer 320 and the second inorganic encapsulation layer 330 through the above multi-layered structure. With this configuration, forming of a path through which external moisture and/or oxygen penetrates into the display area DA may be prevented, minimized, or reduced.

Various suitable functional layers such as a touchscreen layer and a polarizing film may be further provided on the encapsulation layer 300. A capping layer configured to improve light efficiency may be further provided between the second electrode 240 and the encapsulation layer 300.

Figure 4:
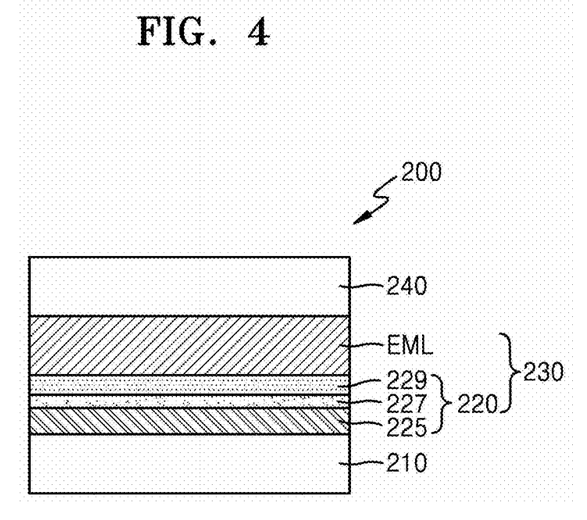
FIG. 4 is a view of a stack structure of an organic light-emitting diode according to another embodiment.

FIG. 3 is a view of a stack structure of the organic light-emitting diode 200 according to an embodiment, and FIG. 4 is a view of a stack structure of the organic light-emitting diode 200 according to another embodiment.

As shown in FIGS. 3 and 4, in the organic light-emitting diode 200 according to an embodiment, the first electrode 210, the intermediate layer 230, and the second electrode 240 are sequentially stacked. In addition, the intermediate layer 230 may include the emission layer EML and the HIL 220.

The first electrode 210 may serve as an anode electrode and may include (e.g., be) a material having a large work function to swiftly inject holes into the emission layer EML. The first electrode 210 may be a reflective electrode, a semi-transmissive electrode, or a transmissive electrode. In the case where the first electrode 210 includes a transmissive electrode, the first electrode 210 may include (e.g., be) at least one selected from among indium tin oxide (ITO), indium zinc oxide (IZO), tin oxide ($SnO_2$), zinc oxide (ZnO), and indium oxide ($In_2O_3$). In the case where the first electrode 210 includes a reflective electrode, the first electrode 210 may include a reflective layer and a transparent layer, the reflective layer including (e.g., being) silver (Ag), magnesium (Mg), aluminum (Al), platinum (Pt), palladium (Pd), gold (Au), nickel (Ni), neodymium (Nd), iridium (Ir), chrome (Cr), or a compound thereof, and the transparent layer including (e.g., being) ITO, IZO, ZnO, and/or $In_2O_3$. In an embodiment, the first electrode 210 may have a single-layered structure or a multi-layered structure of two or more layers. As an example, the first electrode 210 may have a two-layered structure of ITO/Ag or a three-layered structure of ITO/Ag/ITO. In this case, a work function of ITO may be adjusted by plasma treatment.

The intermediate layer 230 may include the HIL 220 and the emission layer EML.

The HIL 220 is arranged between the first electrode 210 and the emission layer EML. The HIL 220 may include (e.g., be) a material having a greater work function than a work function of a material of the first electrode 210. Accordingly, holes injected from the first electrode 210 may be easily injected to the emission layer EML. As an example, in the case where the first electrode 210 has a multi-layered structure, the HIL 220 may include (e.g., be) a material having a greater work function than a work function of a material of an uppermost layer (a layer directly contacting the HIL 220) of the first electrode 210.

The HIL 220 may have a multi-layered structure of an inorganic material.

In an embodiment, as shown in FIG. 3, the HIL 220 may have a two-layered structure. In an embodiment, the HIL 220 may include a second metal compound layer 225 and a second metal layer 227, the second metal compound layer 225 being on the first electrode 210, and the second metal layer 227 being on the second metal compound layer 225. For example, the HIL 220 may include the second metal compound layer 225 and the second metal layer 227, the second metal compound layer 225 being between the first electrode 210 and the emission layer EML, and the second metal layer 227 being between the second metal compound layer 225 and the emission layer EML. For example, in some embodiments, the first electrode 210, the second metal compound layer 225, the second metal layer 227, and the emission layer EML may be sequentially stacked.

The second metal compound layer 225 and the second metal layer 227 of the HIL 220 may include (e.g., be) a material having a large work function to swiftly inject holes into the emission layer EML. For example, a work function of the second metal compound layer 225 and a work function of the second metal layer 227 may each be greater than a work function of the first electrode 210. In some embodiments, a work function of the second metal layer 227 may be greater than a work function of the second metal compound layer 225.

The second metal compound layer 225 and the second metal layer 227 may not be directly deposited on the first electrode 210. For example, in some embodiments, the second metal compound layer 225 and the second metal layer 227 may be indirectly formed through an oxidation-reduction reaction. In an embodiment, the second metal compound layer 225 and the second metal layer 227 are formed through an oxidation-reduction reaction of a first metal layer 221 (see FIG. 8) and a first metal compound layer 223 (see FIG. 8). The HIL 220 may have a stack structure of the second metal compound layer 225 and the second metal layer 227, the second metal compound layer 225 being formed by oxidizing the first metal layer 221 utilizing the first metal compound layer 223, and the second metal layer 227 being formed by reducing the first metal compound layer 223 utilizing the first metal layer 221. A method of forming the second metal compound layer 225 and the second metal layer 227 is described below in more detail with reference to FIG. 8.

A second metal compound of the second metal compound layer 225 may be a dipole material including (e.g., being) a first metal and a halogen element that combine with each other, the first metal being the same metal as a metal of the first electrode 210. In an embodiment, the second metal compound is a material including (e.g., being) the first metal and the halogen element that combine with each other. The second metal compound is a dipole material having a dipole moment, in which electrons shared by atomic nuclei of the first metal and the halogen element are skewed toward the halogen element having higher electronegativity In this case, the first metal is the same metal as a metal of the first electrode 210 and may be one of Ag, Mg, Al, Pt, Pd, Au, Ni, Nd, Ir, and Cr. Because the second metal compound layer 225, which is a lowermost layer of the HIL 220, includes (e.g., is) the same metal as the metal of the first electrode 210, defects such as a short-circuit, a black point, etc. due to metal particles of the first electrode 210 may be prevented or reduced. As an example, in the case where the first electrode 210 has a stack structure of ITO/Ag/ITO, the second metal compound layer 225 may be a dipole material including (e.g., being) Ag and a halogen element that combine with each other, Ag being the same metal as the metal of the first electrode 210.

A halogen element is an element in Group 17 on the periodic table and refers to a non-metallic element that easily obtains electrons and thus exhibits an oxidizing action. As an example, halogen elements may include fluorine (F), chlorine (Cl), bromine (Br), iodine (I), and astatine (At).

According to the present embodiment, because the second metal compound layer 225 including (e.g., being) the second metal compound is arranged between the first electrode 210 and the second metal layer 227, adhesive force between the top surface of the first electrode 210 and the HIL 220 may be improved. In addition, because the second metal compound layer 225 is arranged to cover the top surface of the first electrode 210, surface defects of the top surface of the first electrode 210 may be alleviated or reduced. For example, a smoothing effect and a coverage effect of the top surface of the first electrode 210 may be improved. More detailed descriptions thereof are made below with reference to FIGS. 10A and 10B.

The second metal layer 227 includes (e.g., is) a second metal having a large work function. Because the second metal layer 227 includes (e.g., is) a metal having a large work function, and thus holes are swiftly injected to the emission layer EML, the second metal layer 227 may improve the light-emission efficiency of the organic light-emitting diode 200. In this case, the second metal may be a transition metal in Group 10 (e.g. nickel (Ni), palladium (Pd), platinum (Pt), etc.) and is not limited thereto. For example, the second metal may be any suitable metal having a large work function. In addition, a work function of the second metal layer 227 may be greater than a work function of the first electrode 210 and may be greater than a work function of the second metal compound layer 225.

In another embodiment, as shown in FIG. 4, the HIL 220 may have a three-layered structure. In more detail, the HIL 220 may include the second metal compound layer 225, the second metal layer 227, and a residual layer 229 of the first metal compound layer, the second metal compound layer 225 being on the first electrode 210, the second metal layer 227 being on the second metal compound layer 225, and the residual layer 229 being on the second metal layer 227. For example, the HIL 220 may include the second metal compound layer 225, the second metal layer 227, and the residual layer 229 of the first metal compound layer, the second metal compound layer 225 being between the first electrode 210 and the emission layer EML, the second metal layer 227 being between the second metal compound layer 225 and the emission layer EML, and the residual layer 229 being between the second metal layer 227 and the emission layer EML. In some embodiments, the first electrode 210, the second metal compound layer 225, the second metal layer 227, the residual layer 229, and the emission layer EML are sequentially stacked.

The descriptions of the second metal compound layer 225 and the second metal layer 227 according to the previous embodiment are equally applicable to the second metal compound layer 225 and the second metal layer 227 according to the present embodiment. Hereinafter, repeated description may not be provided, and the residual layer 229 of the first metal compound layer, which is a different element, is mainly described.

The second metal compound layer 225, the second metal layer 227, and the residual layer 229 of the first metal compound layer included in the HIL 220 may include (e.g., be) materials having a large work function such that holes are swiftly injected into the emission layer EML. For example, a work function of the second metal compound layer 225, a work function of the second metal layer 227, and a work function of the residual layer 229 of the first metal compound layer may be greater than a work function of the first electrode 210. In some embodiments, a work function of the second metal layer 227 may be greater than a work function of the second metal compound layer 225 and greater than a work function of the residual layer 229 of the first metal compound layer.

The residual layer 229 of the first metal compound layer is a residual layer that is formed when the first metal compound layer 223 does not completely react and partially remains during an oxidation-reduction reaction during a process of forming the HIL 220. In an embodiment, the second metal compound layer 225 and the second metal layer 227 are formed by an oxidation-reduction reaction of the first metal layer 221 (see FIG. 9) and the first metal compound layer 223 (see FIG. 9). In this case, in the case where the first metal compound layer 223 is formed thick (e.g., thicker or relatively thick) compared to the first metal layer 221, even though the first metal layer 221 completely reacts, a portion of the first metal compound layer 223 does not react and remains to form the residual layer 229 of the first metal compound layer. In this case, as a result, the HIL 220 may have a structure in which the second metal compound layer 225, the second metal layer 227, and the residual layer 229 of the first metal compound layer are sequentially stacked, the second metal compound layer 225 being formed by oxidizing the first metal layer 221 utilizing the first metal compound layer 223, the second metal layer 227 being formed by reducing the first metal compound layer 223 utilizing the first metal layer 221, and the residual layer 229 being formed by not reacting (e.g., by a portion of the first metal compound layer 223 not reacting) and remaining during the oxidation-reduction reaction. A method of forming the second metal compound layer 225, the second metal layer 227, and the residual layer 229 of the first metal compound layer is described below in more detail with reference to FIG. 9.

Because the residual layer 229 of the first metal compound layer is a portion of the first metal compound layer 223 (see FIG. 9), the residual layer 229 of the first metal compound layer includes (e.g., is) a first metal compound of the first metal compound layer 223.

The second electrode 240 may be arranged on the emission layer EML. The second electrode 240 may be a cathode, which is an electron injection electrode. In this case, the second electrode 240 may include (e.g., be) a material having a small work function such that electrons are easily injected. In an embodiment, the second electrode 240 may be implemented as a reflective electrode, a semi-transmissive electrode, or a transmissive electrode by forming a thin film including (e.g., being) Li, Mg, Al, Ag, Al—Li, Ca, Mg—In, Mg—Ag, LiF/Al, and/or LiO$_2$/Al. To obtain a front-emission display apparatus, the second electrode 240 may be implemented as a transmissive electrode including (e.g., being) ITO, IZO, ZnO, and/or In$_2$O$_3$. However, various suitable modifications may be made.

Figure 5:
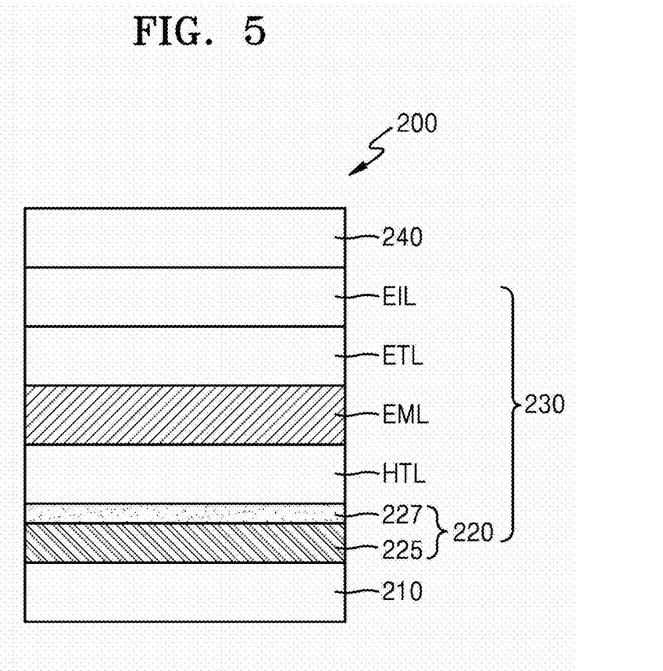
FIG. 5 is a view of a stack structure of an organic light-emitting diode according to another embodiment.
Figure 6:
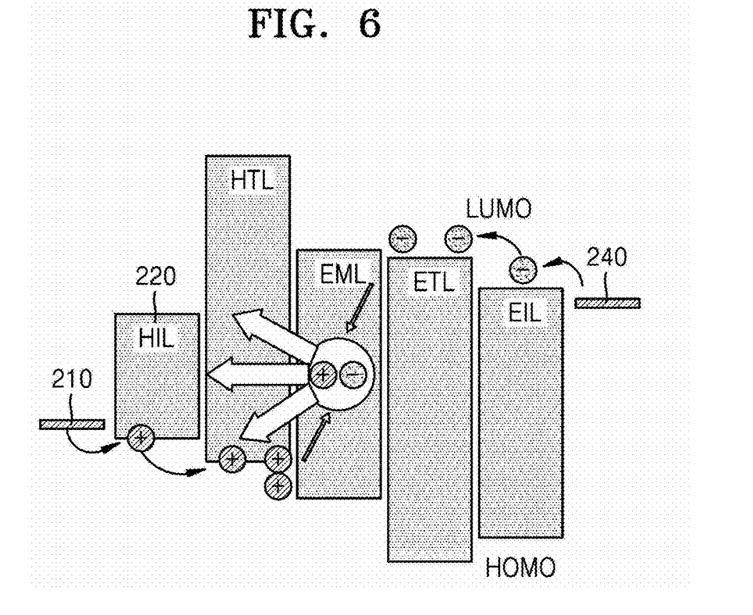
FIG. 6 is an energy diagram of each layer of the organic light-emitting diode of FIG. 5.

FIG. 5 is a view of a stack structure of the organic light-emitting diode 200 according to another embodiment, and FIG. 6 is an energy diagram of each layer of the organic light-emitting diode 200 of FIG. 5.

In the drawings, because the same reference numerals denote the same elements, repeated descriptions thereof may not be provided.

As shown in FIGS. 5 and 6, the organic light-emitting diode 200 may include the first electrode 210, the second electrode 240, and the intermediate layer 230 therebetween, the first electrode 210 and the second electrode 240 facing each other. For example, the first electrode 210 and the second electrode 240 may overlap each other in the plan view.

According to the present embodiment, the intermediate layer 230 may have a structure in which the HIL 220, an HTL, the emission layer EML, an ETL, and an EIL are sequentially stacked. However, the present disclosure is not limited thereto, and some or all of the HIL 220, the HTL, the ETL, and the EIL may be omitted. For example, in some embodiments the intermediate layer 230 may include the HIL 220, the HTL, the emission layer EML, the ETL, and/or the EIL.

In the energy diagram of FIG. 6, a lowermost line is a highest energy level of a valence band and is denoted by a highest occupied molecular orbital (HOMO), and an upper line is a lowest energy level of a conduction band and is denoted by a lowest unoccupied molecular orbital (LUMO). A difference between the HOMO level and the LUMO level is a band gap.

The HIL 220, the HTL, the ETL, and the EIL may be layers introduced to lower an energy wall between layers to allow holes or electrons to easily reach the emission layer EML.

A material of the HIL 220 is a material which may receive holes well from the first electrode 210 and/or the HIL 220. A HOMO of the material of the HIL 220 may be between a Fermi level determining a work function of the material of the HIL 220 and an HOMO of a neighboring organic layer. For example, the HOMO of the hole injection material (e.g., the material of the HIL 220) may be formed at a lower level than the Fermi level determining the work function of the HIL 220

The HIL 220 may include (e.g., be) metal porphyrine, oligo-thiophene, an arylamine-based organic material, hexanitrile hexaazatriphenylene, a quinacridone-base organic material, a perylene-based organic material, anthraquinone-, polyaniline-, and/or polythiophene-based conductive polymers, but the HIL 220 is not limited thereto.

Likewise, the HTL includes (e.g., is) a material that may receive holes well from the HIL 220. The HOMO of the HTL may be lower than the HOMO of the material of the HIL 220.

A material of the EIL is a material that may receive electrons well from the second electrode 240 at a low voltage. The LUMO of the material of the EIL may be between a Fermi level determining the work function of the second electrode 240 and the LUMO of a neighboring organic layer.

Likewise, the material of the ETL is a material that receives electrons well from the EIL. The LUMO of the material of the ETL is higher than the LUMO of the material of the EIL.

In an embodiment, the ETL may include (e.g., be) PBP (4-phenylbenzophenone), t-Bu-PBD (2-(biphenyl-4yl)-5-(4-tert-butylphenyl)-1,3,4-oxadiazole), 3TPYMB(tris-[3-(3-pyridyl)mesityl]borane), and/or B3PYMPM(bis-4,6-(3,5-di-3-pyridylphenyl)-2-methylpyrimi-dine).

Because the organic light-emitting diode 200 according to the present embodiment includes not only the HIL 220 but also various suitable functional layers such that holes and electrons are easily transferred to the emission layer EML, light emission efficiency may be improved even more.

Figure 7:
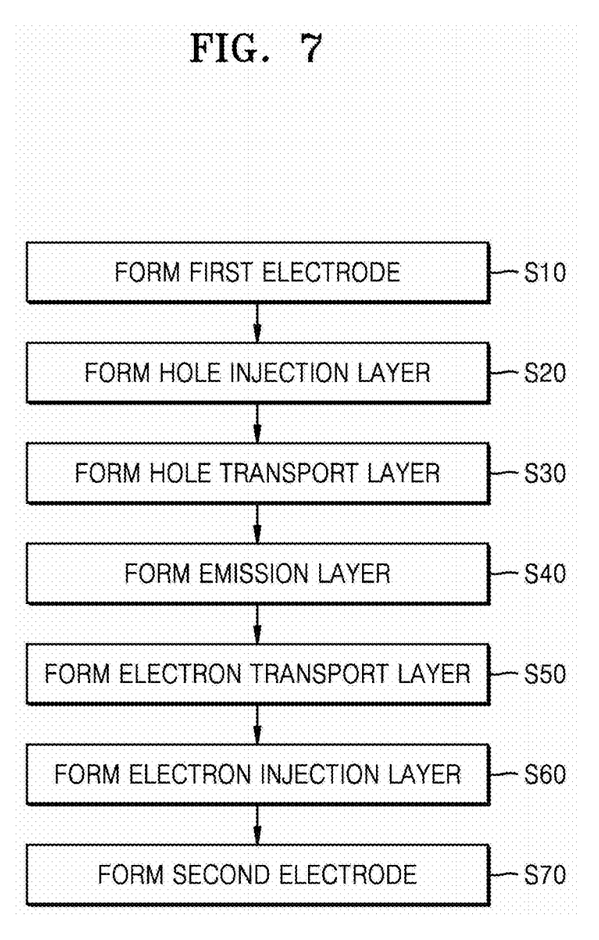
FIG. 7 is a flowchart showing a portion of a method of manufacturing an organic light-emitting diode according to an embodiment.
Figure 8:
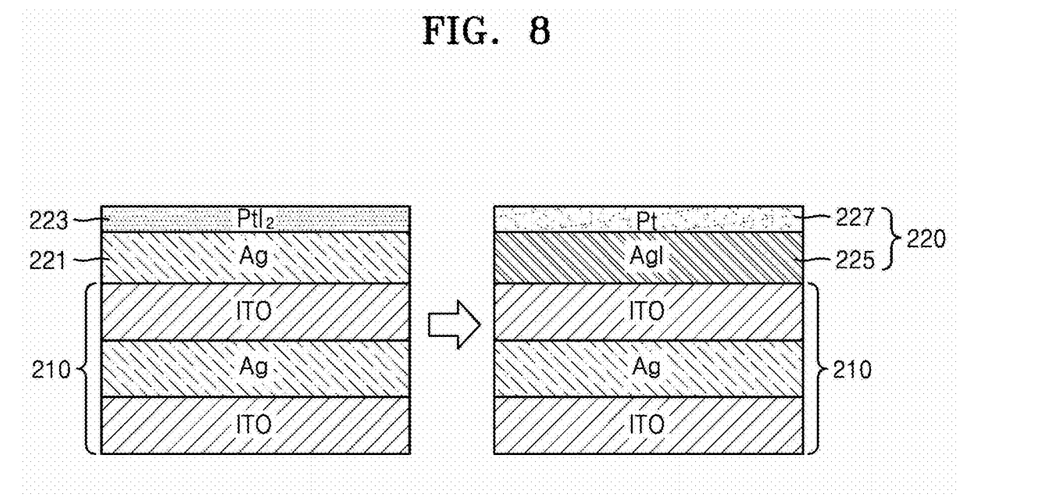
FIG. 8 is a view showing figures before and after an oxidation-reduction reaction according to an embodiment.
Figure 9:
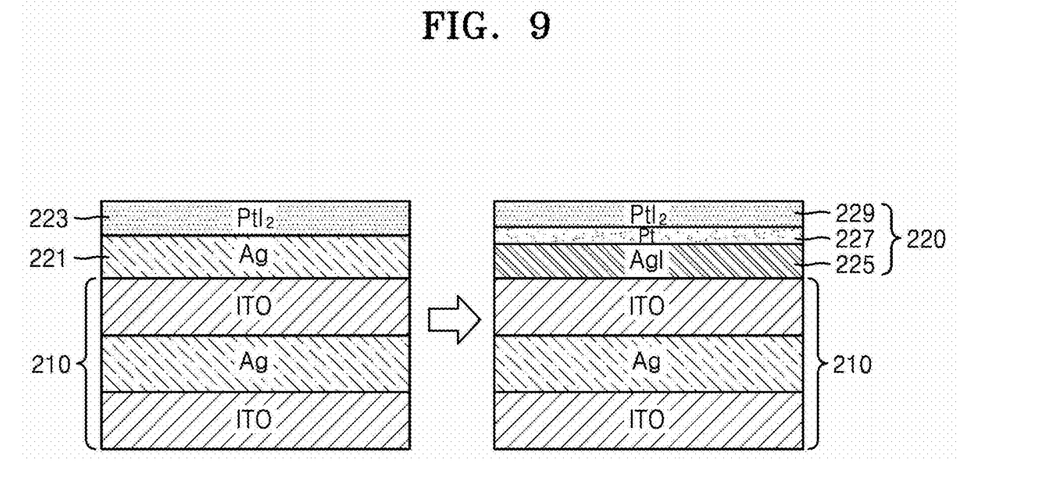
FIG. 9 is a view showing figures before and after an oxidation-reduction reaction according to another embodiment.

FIG. 7 is a flowchart showing a portion of a method of manufacturing an organic light-emitting diode according to an embodiment, FIG. 8 is a view showing figures before and after an oxidation-reduction reaction according to an embodiment, and FIG. 9 is a view showing figures before and after an oxidation-reduction reaction according to another embodiment.

As shown in FIG. 7, a method of manufacturing an organic light-emitting diode according to an embodiment may include operation (act) S10 of forming the first electrode, operation S20 of forming the HIL, operation S30 of forming the HTL, operation S40 of forming the emission layer EML, operation S50 of forming the ETL, operation S60 of forming the EIL, and operation S70 of forming the second electrode.

As described above, one or more of the HIL 220, the HTL, the ETL, and the EIL may be omitted in some embodiments. Accordingly, some or all of operation S20, operation S30, operation S50, and operation S60 may be omitted.

Operation S10 is an operation of forming the first electrode 210 including (e.g., being) the first metal.

Operation S20 is an operation of forming the HIL 220 on the first electrode 210.

In the case where the HIL 220 includes the second metal compound layer 225 and the second metal layer 227, operation S20 includes an operation of forming the first metal layer 221 on the first electrode 210 and the first metal compound layer 223 on the first metal layer 221. The operation S20 may include (e.g., further include) an operation of forming the HIL 220 including the second metal compound layer 225 and the second metal layer 227, the second metal layer 227 being on the second metal compound layer 225, the second metal compound layer 225 being formed by oxidizing the first metal layer 221 utilizing the first metal compound layer 223, and the second metal layer 227 being formed by reducing the first metal compound layer 223 utilizing the first metal layer 221. For example, the second metal compound layer 225 and the second metal layer 227 may be formed by an oxidation-reduction reaction between the first metal layer 221 and the first metal compound layer 223.

For example, when the first metal layer 221 and the first metal compound layer 223 on the first metal layer 221 are sequentially formed, the first metal layer 221 and the first metal compound layer 223 perform an oxidation-reduction reaction to form the second metal compound layer 225 and the second metal layer 227 on the second metal compound layer 225. As described above, according to embodiments, the layers constituting the HIL 220, for example, the second metal compound layer 225 and the second metal layer 227, or the second metal compound layer 225, the second metal layer 227, and the residual layer 229, may be indirectly formed through an oxidation-reduction reaction without directly depositing them (e.g., without directly forming the second metal compound layer 225 on the first electrode 210 and directly forming the second metal layer 227 on the second metal compound layer 225). Accordingly, materials having a large work function that are difficult to apply to the process due to a very high melting point may be utilized through a more convenient and economic process.

The first metal layer 221 includes (e.g., is) the first metal, which is the same as the metal of the first electrode 210. The first metal compound of the first metal compound layer 223 may be a material including (e.g., being) the second metal of the second metal layer 227 and a halogen element that combine with each other.

In an embodiment, as shown in FIG. 8, the first electrode 210 may include (e.g., be) a stack structure of ITO/Ag/ITO, the first metal layer 221 may include (e.g., be) Ag as the first metal, and the first metal compound layer 223 may include (e.g., be) PtI$_2$ including Pt and I that combine with each other, Pt being the second metal of the second metal layer 227, and I being a halogen element. When the first metal layer 221 is formed on the first electrode 210 and the first metal compound layer 223 is formed on the first metal layer 221, an oxidation-reduction reaction as shown in Reaction Formula 1 occurs.

PtI$_2$+2Ag→Pt+2AgI       Reaction Formula 1

According to Reaction Formula 1, Ag is oxidized by PtI$_2$ to form AgI, and PtI$_2$ is reduced by Ag to form Pt. For example, the first metal layer 221 including (e.g., being) Ag is oxidized by the first metal compound layer 223 including (e.g., being) PtI$_2$ to form the second metal compound layer 225 including (e.g., being) AgI. The first metal compound layer 223 including (e.g., being) PtI$_2$ is reduced by the first metal layer 221 including (e.g., being) Ag to form the second metal layer 227 including (e.g., being) Pt.

In this case, in the case where a ratio of the first metal compound and the first metal is a ratio in which the first metal compound and the first metal completely react with each other, the first metal compound or the first metal does not remain after the oxidation-reduction reaction. For example, the first metal layer 221 may be substantially or entirely oxidized and the first metal compound layer 223 may be substantially or entirely reduced during the oxidation-reduction reaction.

Unlike this, in the case where a ratio of the first metal compound and the first metal, which are reactants, is a ratio in which only the first metal completely reacts and only a portion of the first metal compound reacts, a portion of the first metal compound remains after the oxidation-reduction reaction and thus the residual layer 229 of the first metal compound layer may be formed. For example, the first metal layer 221 may be substantially or entirely oxidized and the first metal compound layer 223 may be partially reduced during the oxidation-reduction reaction such that a portion (e.g., an uppermost portion) of the first metal compound layer 223 may remain (e.g., may not be reduced) after the oxidation-reduction reaction has ended.

In the case where the HIL 220 includes (e.g., is) the second metal compound layer 225, the second metal layer 227, and the residual layer 229 of the first metal compound layer, operation S20 includes an operation of forming the first metal layer 221 on the first electrode 210 and an operation of forming the HIL 220, the operation of forming the HIL 220 including forming the first metal compound layer 223 on the first metal layer 221 to include the second metal compound layer 225, the second metal layer 227 on the second metal compound layer 225, and the residual layer 229 of the first metal compound layer, wherein the second metal compound layer 225 is formed by oxidizing the first metal layer 221 utilizing the first metal compound layer 223, and the second metal layer 227 is formed by reducing the first metal compound layer 223 utilizing the first metal layer 221. For example, the operation of forming the HIL 220 may include forming, on the first metal layer 221, the material of the first metal compound layer 223 in an amount greater than is needed for the first metal layer 221 to be substantially or entirely oxidized during the oxidation-reduction reaction between the first metal layer 221 and the first metal compound layer 223, such that a portion (e.g., an uppermost portion) of the first metal compound layer 223 remains (e.g., is not reduced) after the first metal layer 221 is substantially or entirely oxidized. The portion of the first metal compound layer 223 that remains after the first metal layer 221 is substantially or entirely oxidized may be the residual layer 229.

For example, when the first metal layer 221 on the first electrode 210, and the first metal compound layer 223 on the first metal layer 221 are sequentially formed, the first metal layer 221 and the first metal compound layer 223 perform an oxidation-reduction reaction, and accordingly, the second metal compound layer 225, the second metal layer 227 on the second metal compound layer 225, and the residual layer 229 of the first metal compound layer on the second metal layer 227 are formed.

Operation S30 is an operation of forming an HTL on the HIL 220, operation S40 is an operation of forming the emission layer EML on the HTL, operation S50 is an operation of forming an ETL on the emission layer EML, operation S60 is an operation of forming an EIL on the ETL, and operation S70 is an operation of forming the second electrode 240 on the EIL. Because more detailed descriptions of operations S30 to S70 are the same as those described above, the descriptions may not be provided.

Figure 10A:
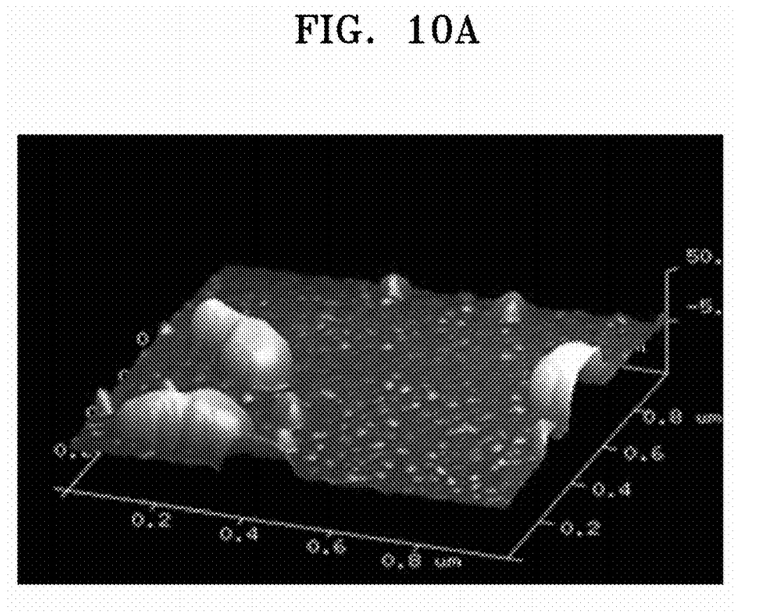
FIGS. 10A and 10B are atomic force microscopy (AFM) images of a surface of a first electrode according to an embodiment.
Figure 10B:
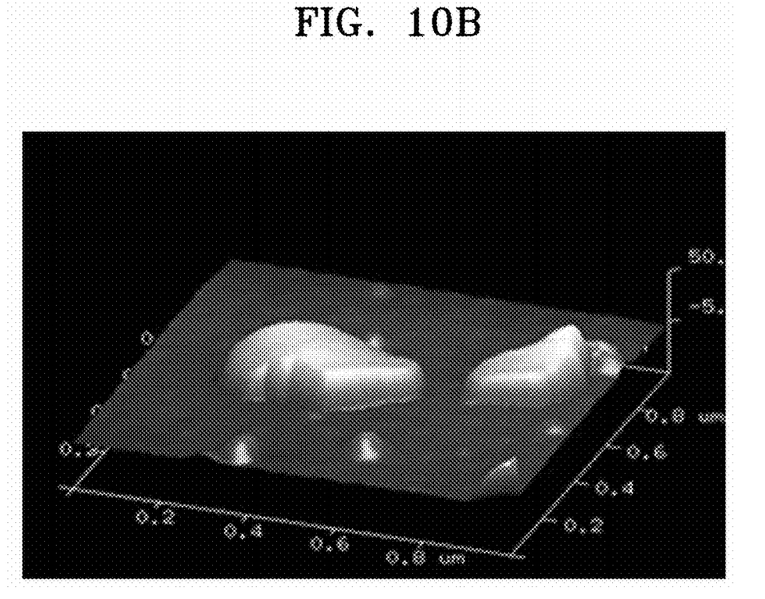

FIGS. 10A and 10B are atomic force microscopy (AFM) images of the surface of the first electrode 210 according to an embodiment.

In an embodiment, FIG. 10A is an AFM image of the surface of the first electrode 210 before the metal compound layer is formed on the first electrode 210 having an uppermost layer including (e.g., being) ITO, and FIG. 10B is an AFM image of the surface of the first electrode 210 after the metal compound layer is formed on the first electrode 210 having an uppermost layer including (e.g., being) ITO.

Referring to FIGS. 10A and 10B, the surface of the first electrode 210 before the metal compound layer is formed on the first electrode 210 is rough and uneven due to surface defects. In contrast, the surface of the first electrode 210 after the metal compound layer is formed on the first electrode 210 is more smooth and flat because the surface defects are alleviated.

This means that an adhesive force between the first electrode 210 and the HIL 220 may be improved in the case where the metal compound layer is arranged between the metal layer and the first electrode 210, compared to the case where the metal layer including (e.g., being) a metal having a large work function is directly formed on the first electrode 210. In addition, because the metal compound layer covers the surface of the first electrode 210, defects due to metal particles of the first electrode 210 may be prevented or reduced.

In the above, though only the organic light-emitting diode and the method of manufacturing the same are mainly described, the present disclosure is not limited thereto. As an example, a display apparatus including the organic light-emitting diodes and a method of manufacturing the display apparatus also fall within the scope of the present disclosure.

According to an embodiment, an organic light-emitting diode in which light-emitting efficiency is improved and which is advantageous in an aspect of process, and a method of manufacturing the same may be implemented. However, the disclosure is not limited by such an effect.

It should be understood that embodiments described herein should be considered in a descriptive sense only and not for purposes of limitation. Descriptions of features and/or aspects within each embodiment should typically be considered as available for other similar features and/or aspects, respectively, in other embodiments. While one or more embodiments have been described with reference to the drawings, it will be understood by those of ordinary skill in the art that various suitable changes in form and details may be made therein without departing from the spirit and scope of the present disclosure as defined by the following claims and equivalents thereof.

What is claimed is:

1. An organic light-emitting diode comprising:
   a first electrode and a second electrode facing each other;
   an organic emission layer between the first electrode and the second electrode; and
   a hole injection layer between the first electrode and the organic emission layer,
   wherein the hole injection layer comprises a second metal compound layer and a second metal layer, the second metal compound layer being between the first electrode and the organic emission layer, and the second metal layer being between the second metal compound layer and the organic emission layer.

2. The organic light-emitting diode of claim 1, wherein a second metal compound of the second metal compound layer comprises a dipole material comprising a first metal and a halogen element, the first metal being the same as a metal of the first electrode.

3. The organic light-emitting diode of claim 1, wherein a work function of the second metal compound layer and a work function of the second metal layer are each greater than a work function of the first electrode.

4. The organic light-emitting diode of claim 3, wherein a work function of the second metal layer is greater than a work function of the second metal compound layer.

5. The organic light-emitting diode of claim 1, wherein the hole injection layer further comprises a residual layer of a first metal compound layer, the residual layer being between the second metal layer and the organic emission layer.

6. The organic light-emitting diode of claim 5, wherein a first metal compound of the first metal compound layer comprises a material comprising a second metal of the second metal layer and a halogen element.

7. The organic light-emitting diode of claim 6, wherein a second metal compound of the second metal compound layer comprises a dipole material comprising a first metal and a halogen element, the first metal being the same as a metal of the first electrode.

8. The organic light-emitting diode of claim 5, wherein a work function of the first metal compound layer, a work function of the second metal compound layer, and a work function of the second metal layer are each greater than a work function of the first electrode.

9. The organic light-emitting diode of claim 8, wherein the work function of the second metal layer is greater than the work function of the first metal compound layer and greater than the work function of the second metal compound layer.

10. The organic light-emitting diode of claim 1, further comprising a hole transport layer between the hole injection layer and the organic emission layer.

* * * * *